United States Patent [19]

Weidemann

[11] 3,893,162

[45] July 1, 1975

[54] RESILIENT TUBULAR MEMBER FOR HOLDING A SEMICONDUCTOR DEVICE TOGETHER UNDER PRESSURE

[75] Inventor: Erwin Weidemann, Erlangen, Germany

[73] Assignee: Siemens Aktiengesellschaft, Munich, Germany

[22] Filed: May 30, 1974

[21] Appl. No.: 474,801

Related U.S. Application Data

[63] Continuation of Ser. No. 334,931, Feb. 22, 1973, abandoned.

[30] Foreign Application Priority Data

Mar. 2, 1972 Germany ............................ 2209993

[52] U.S. Cl. ........................ 357/82; 357/74; 357/79

[51] Int. Cl. ............................. H01l 3/00; H01l 5/00

[58] Field of Search .............. 357/74, 80, 81, 82, 79

[56] References Cited

UNITED STATES PATENTS

| | | | |
|---|---|---|---|
| 3,004,196 | 10/1961 | Drexel | 357/82 |
| 3,364,987 | 1/1968 | Bylund et al. | 357/82 |
| 3,475,660 | 10/1969 | Coblenz | 357/82 |
| 3,551,758 | 12/1970 | Ferree | 357/82 |
| 3,623,339 | 11/1971 | Muller | 357/82 |
| 3,703,668 | 11/1972 | Bylund et al. | 357/82 |

FOREIGN PATENTS OR APPLICATIONS

| | | | |
|---|---|---|---|
| 337,262 | 11/1971 | Sweden | 357/82 |

OTHER PUBLICATIONS

Packaging Electronics Dec. 6, 1971; pages 40–42.

*Primary Examiner*—Andrew J. James
*Attorney, Agent, or Firm*—Kenyon & Kenyon Reilly Carr & Chapin

[57] ABSTRACT

A semiconductor arrangement is disclosed which includes a cooling channel and a semiconductor package disposed in the channel. The semiconductor package has at least one semiconductor component having a disc-like configuration and contact members disposed on both sides of this component respectively. The cooling channel is made of resilient material for resiliently holding the semiconductor package together under pressure.

10 Claims, 2 Drawing Figures

RESILIENT TUBULAR MEMBER FOR HOLDING A SEMICONDUCTOR DEVICE TOGETHER UNDER PRESSURE

This is a continuation of application Ser. No. 334,931, filed Feb. 22, 1973, now abandoned.

BACKGROUND OF THE INVENTION

The invention relates to a semiconductor arrangement wherein one or more semiconductor components having a disc-like configuration forms a package together with contact members disposed on both sides of the component. The package is housed in a cooling channel which holds the package in a force-tight manner.

Current converters are known having thyristors housed in a screw-type housing. In this construction, the thyristors are cooled primarily by air. In a current converter disclosed in Deutsche Offenlegungsschrift No. 1,914,790, thyristors are disposed in disc-like housings and are stacked with cooling-boxes interposed. The cooling boxes have inflow and outflow conduits for the cooling fluid as well as electric connectors. An energy storage device in the form of a spring acts to clamp each stack as an assembled unit between two mutually adjacent support locations of a frame. From Deutsche Offenlegungsschrift No. 1,917,285 it is known how to dispose thyristors with their disc-like housings adjacent to one another. Here each disc-like housing forms a package with contact members disposed at both sides, the contact members serving as electric connectors. A number of such packages are set between two bars through which a cooling medium flows. The bars are held together by brackets with elastic yokes. The bar through which the cooling medium flows serves as an electrical connecting member for connecting together the connecting terminals of the mutually adjacent semiconductor components disposed on the same side and which are at the same potential. The cooling bar arranged at the other side of the disc-like housing is, through interposed insulating elements, in contact with the contact members of the semiconductor housing. With this form of construction, a relatively large amount of space is needed, and in many applications such as in aircraft, the relatively great weight is a disadvantage. This also applies to rectifier arrangements wherein the diodes are disposed in a similar fashion.

In the U.S. Pat. application Ser. No. 310876, filed on Nov. 30, 1972, now U.S. Pat. No. 3,874,885 issued Jan. 8, 1974, an arrangement is disclosed wherein the semiconductor components are disposed in a disc-like housing between two electrical connecting members and the component pieces forming a package are inserted into a tube with a plate spring interposed. The tube serves to establish a force-tight hold and as a cooling channel. The insertion is made in such a way that the axis of the disc-like housing is situated transversely of the tube axis. With this configuration there is obtained improved cooling and a protective housing as well as a vibration-free and shock-resistant holding of the components. With all this, there is also obtained a simple conduction of the coolant and a compact closed construction with less weight.

SUMMARY OF THE INVENTION

It is an object of the invention to further decrease the weight and bulk of a semiconductor assembly. In a semiconductor arrangement of the kind mentioned above and in accordance with the invention, the cooling channel is made to resiliently hold the semiconductor package together under pressure.

The semiconductor arrangement of the invention includes as a feature a cooling channel and a semiconductor package disposed in the channel. The semiconductor package includes at least one semiconductor component having a disc-like configuration and contact members disposed on both sides of the component respectively. The cooling channel is made of resilient material for resiliently holding the semiconductor package together under pressure.

In this way the invention makes it possible to do without additional springs for obtaining the necessary contact pressure of the semiconductor components in the structural unit. In this way a further simplification of the assembly is achieved and both dimensions and weight are further decreased. For inserting thyristors and the contact components, the tube need only to be compressed laterally so that the internal profile is increased in a direction transverse of the direction in which the pressure is applied. In this way, the assembly unit can easily be pushed into the cooling channel. This also results in a shortening and simplification of assembly.

Although the invention is illustrated and described herein as a semiconductor arrangement, it is nevertheless not intended to be limited to the details shown, since various modifications may be made therein within the scope and the range of the claims. The invention, however, together with additional objects and advantages will be best understood from the following description and in connection with the accompanying drawings.

DESCRIPTION OF THE PREFERRED EMBODIMENTS OF THE INVENTION

Figure 1:
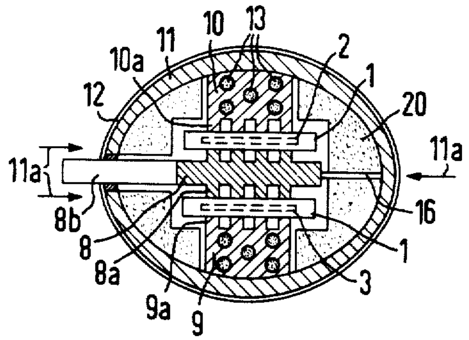
FIG. 1 is a section view of a semiconductor arrangement according to the invention. The view is taken at a plane perpendicular to the longitudinal axis of the cooling channel.

Referring to FIG. 1, the semiconductor components 2, 3 are each arranged in a disc-like housing 1 and are assembled into a package with electric contact members 8 to 10 interposed, the members 8 to 10 having legs 8*a* to 10*a*. The entire assembly is housed under pressure in a cooling channel 11. The cooling channel 11 resiliently holds the components and members 1 to 3 and 8 to 10 together. For this purpose, the cooling channel 11 is in the form of an elastic tube. Preferably the tube is insulated at least on the inside and is made of a material having good elastic characteristics such as spring steel or synthetic material reinforced with glass fibers, and preferably having a high modulus of elasticity such as at least 230,000 $kp/cm^2$. Because of this, the cooling channel 11 can be easily pressed together in the direction of the arrows 11*a* thus increasing the height transverse to this direction in such a way that a package of components can be introduced into the cooling channel 11 and clamped there without using a pressure-applying device. Because an insulated tube is used, there is no need to dispose any electrically-insulating elements directly in the cooling path. Thus the cooling is substantially improved when compared with the configuration disclosed in Deutsche Offenlegungsschrift No. 1,917,285.

In accordance with a preferred embodiment of the invention, the cooling channel 11 has a cross-section having a defined outline, in particular, an elliptical cross-section with which it is possible to obtain different applied pressures by making the elastic travel more or less. The cooling channel may also be made with nonuniform wall thicknesses.

A package comprising two semiconductor components 2, 3 and contact members 8 to 10 are housed in the cooling channel 11. The middle contact member 8 has legs 8*a* and is provided with an electrical connector pin 8*b* that extends to the outside through an opening in the cooling channel 11 in a direction transverse of the channel axis and is connected to a conductor terminal. For improving the cooling, the internal profile of the tube is made to approximate the profile of the package by means of inserts 20.

Figure 2:
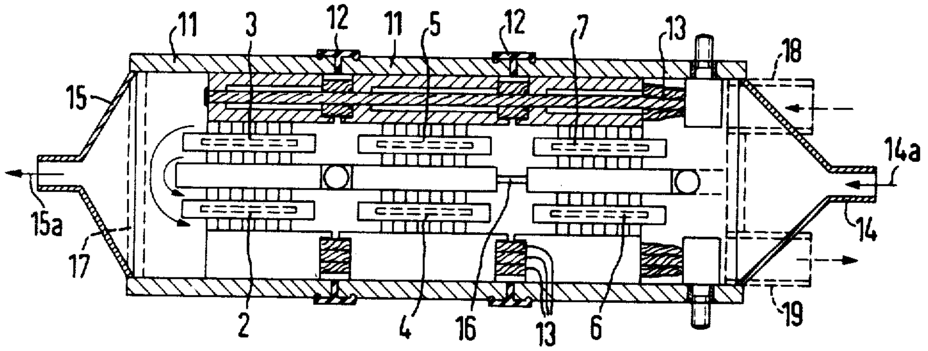
FIG. 2 is a longitudinal section of a thyristor assembly made up of a plurality of semiconductor arrangements arranged in series.

To make it possible to assemble the required number of semiconductor components required for a current converter into one structural unit (FIG. 2), a number of cooling channels 11 are provided with a suitable number of semiconductor components 2 to 7 and contact members; these channels are arranged in series with insulating rings 12 interposed. The unit made up of a number of packages wired by means of flexible conductors 13 (copper braids or strands) can be pushed into the assembled cooling channel sections. Only at the ends of the common cooling channel is there a need for connectors, 14, 15 for the cooling medium. The cooling medium is represented by arrows 14*a*, 15*a* which show that this medium can be introduced at the one end and can be carried away at the other end. By applying a longitudinal bulkhead 16 and a wall 17 (shown by broken lines), it is however also possible to provide the inflow and outflow openings for the coolant at one end of the channel as shown by the stub openings 18, 19 depicted in outline also by broken lines. Thus any desired functional units can be formed which also afford a simple assembly system for the cooling. At the same time the result is also more satisfactory with regard to maintenance and repairs.

What is claimed is:

1. An arrangement for holding the parts of a semiconductor package together under pressure and for directing a coolant over the package, the arrangement comprising: a cooling channel for receiving the semiconductor package therein and for directing a flow of the coolant thereover; the semiconductor package including at least one semiconductor component having a disc-like configuration, and contact members disposed on both sides of said component respectively; said cooling channel being made of resilient material and being in a tensioned condition so as to cause the same to apply a spring-like force directly to said package, said component and said contact members being disposed with respect to said force to conjointly coact with said channel to cause said force to hold said package together under pressure.

2. The semiconductor arrangement of claim 1, said cooling channel being a tube made of synthetic material reinforced with glass fibers.

3. The semiconductor arrangement of claim 2, said cooling channel having an elliptical cross-section.

4. The semiconductor arrangement of claim 1, said cooling channel having a non-uniform wall thickness.

5. The semiconductor arrangement of claim 1, said cooling channel being a resilient steel tube insulated at least at the interior thereof.

6. The semiconductor arrangement of claim 5, said cooling channel having an elliptical cross-section.

7. The semiconductor arrangement of claim 1 comprising additional cooling channels, each of said cooling channels being provided with at least two of said disc-like semiconductor components said two semiconductor components of each cooling channel having respective mutually adjacent surfaces defining a space therebetween, said contact members comprising for each cooling channel first and second contact members, said contact members being disposed at the respective surfaces of said semiconductor components facing away from said space, and a third contact member disposed in said space and contacting the respective surfaces of said semiconductors facing said space; and a plurality of insulating rings, said cooling channels being arranged in series with corresponding ones of said insulating rings being disposed between each two mutually adjacent ones of said cooling channels.

8. An arrangement for holding the parts of a semiconductor package together under pressure and for directing a coolant over the package, the arrangement comprising:

a). an essentially elliptically shaped, cooling channel made of a resilient material, having a minor axis and a major axis;

b. a semiconductor package including at least one semiconductor component having a disc-like configuration and contact therewith, the overall height of said semiconductor package from the outside of the contact member on one side to the outside of the contact member on the other side as measured along an axis through said disc-like semiconductor and perpendicular thereto being greater than the inner diameter of said cooling channel along its minor axis, said semiconductor package inserted within said cooling channel with said perpendicular axis essentially parallel to said minor axis, said cooling channel thereby being in a tension condition so as to cause the same to apply a spring-like force to said package with said force holding said package together under pressure, and wherein said package can be inserted into and removed from said resilient cooling channel by applying an inward pressure to the outsides of said channel along its major axis to compress it along its major axis and expand it along its minor axis.

9. The semiconductor arrangement of claim 8 said cooling channel being a tube made of synthetic material reinforced with glass fibers.

10. The semiconductor arrangement of claim 9 said cooling channel having a non-uniform wall thickness.

* * * * *